United States Patent
Natarajan et al.

(10) Patent No.: US 10,430,108 B2
(45) Date of Patent: Oct. 1, 2019

(54) CONCURRENT COPYING OF FIRST AND SECOND SUBSETS OF PAGES FROM MEDIA SUCH AS SLC NAND TO MEDIA SUCH AS QLC OR MLC NAND FOR COMPLETION OF COPYING OF DATA

(71) Applicant: INTEL CORPORATION, Santa Clara, CA (US)

(72) Inventors: Shankar Natarajan, Santa Clara, CA (US); Aliasgar S. Madraswala, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 89 days.

(21) Appl. No.: 15/721,483

(22) Filed: Sep. 29, 2017

(65) Prior Publication Data
US 2019/0102102 A1    Apr. 4, 2019

(51) Int. Cl.
| G06F 13/00 | (2006.01) |
| G06F 3/06  | (2006.01) |
| G11C 11/56 | (2006.01) |
| G06F 11/10 | (2006.01) |
| G11C 16/04 | (2006.01) |

(52) U.S. Cl.
CPC .......... *G06F 3/0647* (2013.01); *G06F 3/0613* (2013.01); *G06F 3/0679* (2013.01); *G06F 11/1072* (2013.01); *G11C 11/5621* (2013.01); *G11C 11/5628* (2013.01); *G11C 16/0483* (2013.01); *G11C 2211/5622* (2013.01); *G11C 2211/5641* (2013.01)

(58) Field of Classification Search
CPC .... G06F 3/0647; G06F 3/0613; G06F 3/0679; G06F 11/1072; G11C 2211/5641; G11C 11/5628; G11C 16/0483; G11C 11/5621; G11C 2211/5622

USPC .............................. 365/185.03; 711/103, 161
See application file for complete search history.

(56) References Cited

U.S. PATENT DOCUMENTS

| 8,060,719 B2 * | 11/2011 | Radke ................. G06F 12/0246 711/103 |
| 8,281,061 B2 * | 10/2012 | Radke ................. G11C 11/5628 711/103 |
| 10,109,361 B1 * | 10/2018 | Khakifirooz ....... G11C 16/3481 |
| 2018/0253240 A1 * | 9/2018 | Alhussien ............. G06F 3/0619 |

OTHER PUBLICATIONS

ONFI Workgroup, "Open NAND Flash Interface Specification", Revision 4.0, Apr. 2, 2014, 315 pp.

* cited by examiner

*Primary Examiner* — Hong C Kim
(74) *Attorney, Agent, or Firm* — Konrad Raynes Davda & Victor LLP; Rabindranath Dutta

(57) ABSTRACT

A determination is made that data has to be moved internally within a non-volatile memory from a plurality of pages of a first type of storage media to a page of a second type of storage media. A first subset of the plurality of pages is copied from the first type of storage media to the page of the second type of storage media. Concurrently with the copying of the first subset of the plurality of pages, a second subset of the plurality of pages is copied from the first type of storage media to the page of the second type of storage media. In response to completion of the copying of the first subset and the second subset of the plurality of pages, it is determined that the copying of the data from the first type of storage media to the second type of storage media has completed.

20 Claims, 10 Drawing Sheets

CONCURRENT COPYING OF FIRST AND SECOND SUBSETS OF PAGES FROM MEDIA SUCH AS SLC NAND TO MEDIA SUCH AS QLC OR MLC NAND FOR COMPLETION OF COPYING OF DATA

BACKGROUND

A solid state drive (SSD) is a data storage device that uses integrated circuit assemblies as memory to store data persistently. SSDs have no moving mechanical components and this distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and less latency. Many types of SSDs use NAND-based flash memory which comprises an electronic (solid-state) non-volatile computer storage medium that can be electrically erased and reprogrammed.

NAND-based flash memory stores information (i.e., data) in individual memory cells. In single-level cell (SLC) NAND flash technology, each memory cell may exist in one of two voltage states, storing one bit of information per memory cell. A multi-level cell (MLC) is a memory cell capable of storing more than a single bit of information. For example, a MLC NAND flash memory that has sixteen possible voltage states per memory cell may store four bits of information per memory cell, and may be referred to as a quad-level cell (QLC) NAND.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

Certain SSDs may be configured such that the NAND memory of a SSD is configured into SLC blocks and QLC blocks. The SLC blocks may comprise relatively faster media in comparison to the QLC blocks that may comprise relatively slower media. Reads and writes to the relatively faster media may be performed relatively faster in comparison to reads and writes to the relatively slower media. Since there is a relatively small amount of SLC blocks in comparison to the amount of QLC blocks, the firmware of the SSD may periodically copy data from the relatively faster SLC blocks to the relatively slower QLC blocks, so that the data storage space provided by the SLC blocks is prevented from getting completely filled up.

The copying of data from the SLC blocks to the QLC blocks may be performed by reading the data out from SLC blocks to Application-Specific Integrated circuit (ASIC) Static Random Access Memory (SRAM) located in the controller of the SSD, and then writing the data back from the ASIC SRAM to the QLC blocks, or by internally moving the data within the NAND memory from the SLC blocks to the QLC blocks. Internally moving the data within the NAND memory from the SLC blocks to the QLC blocks provides significant write bandwidth improvement over reading the data out from the SLC blocks to ASIC SRAM, and then writing the data back from the ASIC SRAM to QLC blocks, by avoiding the input/output (I/O) of data from and to the NAND memory.

Certain embodiments provide mechanisms in which a NAND memory in a SSD is configured into SLC blocks and QLC blocks, and internal data movements are performed from SLC blocks to QLC blocks. As a result, the write bandwidth of the SSD increases in comparison to situations in which data is read out from SLC blocks to the controller of the SSD, and then the data written from the controller of the SSD to QLC blocks.

Figure 1:
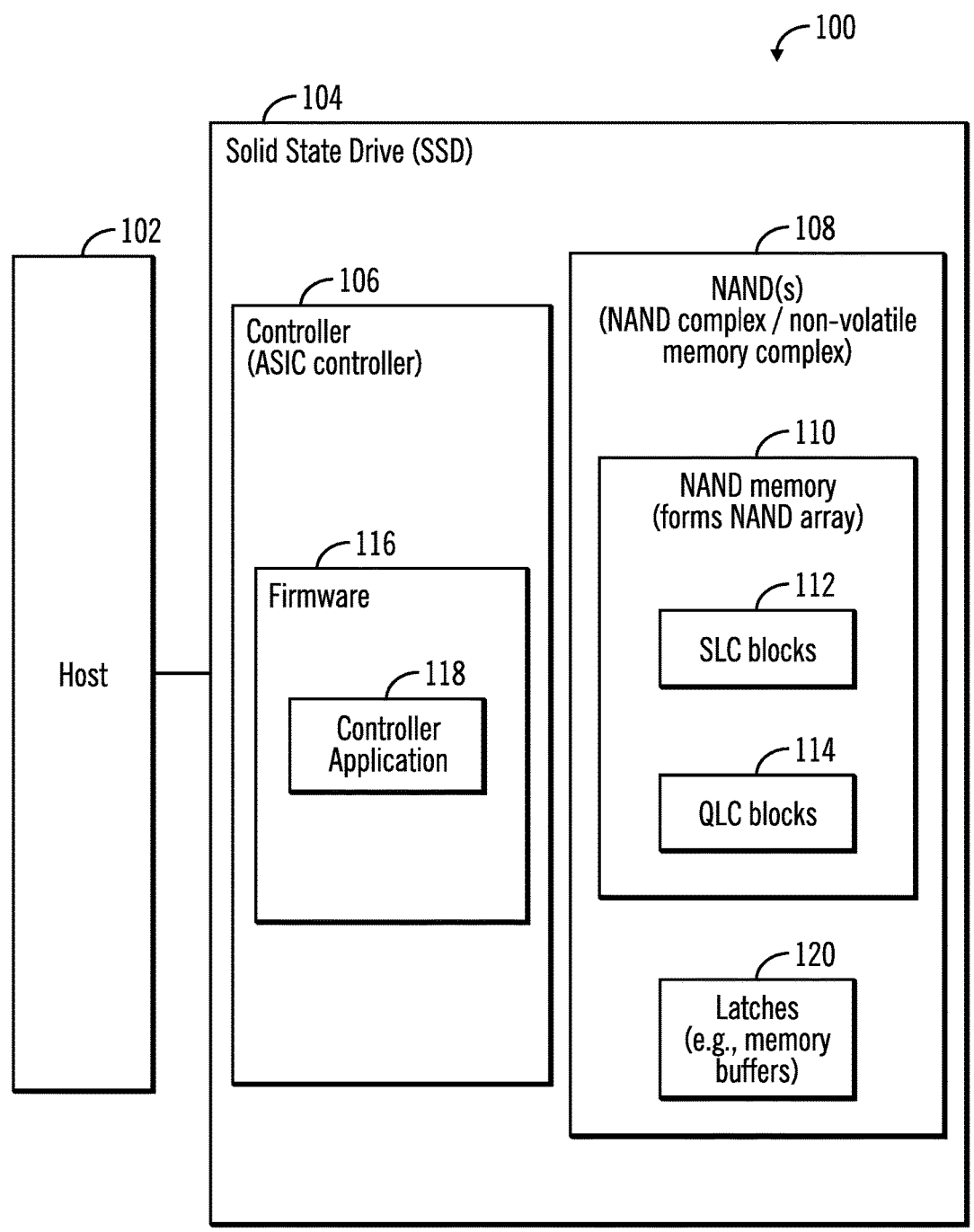
FIG. 1 illustrates a block diagram of a computing environment in which a host is coupled to a SSD comprised of NAND memory configured into SLC and QLC blocks, in accordance with certain embodiments.

FIG. 1 illustrates a block diagram of a computing environment 100 in which a host 102 is coupled to a SSD 104, in accordance with certain embodiments. The SSD 104 may be comprised of a controller 106 and a NAND complex 108. The NAND complex 108 may also be referred to as a non-volatile memory complex that is comprised of a plurality of non-volatile memory modules that are directly or indirectly coupled, i.e., the non-volatile memory modules that are directly or indirectly coupled form a complex that is referred to as a non-volatile memory complex.

In certain embodiments, the NAND complex 108 may be comprised of a plurality of NAND memory 110 that may form a NAND array. In certain embodiments the NAND complex 108 may be a multi-level cell (MLC) NAND (e.g., such as a triple-level cell (TLC) NAND or a quad-level cell (QLC) NAND) or any other type of NAND or any other type of non-volatile memory complex, where each of the memory cells of the NAND complex 108 in the SSD 104 may store more than 1 bit of information. In other embodiments, the SSD 104 may be comprised of a controller 106 that controls certain other types of non-volatile memory, such as NOR memory or some other suitable non-volatile memory. Nonvolatile memory is a storage medium that does not require power to maintain the state of data stored by the medium. Nonlimiting examples of nonvolatile memory may include any or a combination of: solid state memory [such as planar or three Dimensional (3D) NAND flash memory or NOR flash memory], 3D crosspoint memory, storage devices that use chalcogenide phase change material (e.g., chalcogenide glass), byte addressable nonvolatile memory devices, multi-threshold level NAND flash memory, ferroelectric memory, silicon-oxide-nitride-oxide-silicon (SONOS) memory, polymer memory (e.g., ferroelectric polymer memory), ferroelectric transistor random access memory (Fe-TRAM) ovonic memory, nanowire memory, electrically erasable programmable read-only memory (EEPROM), other various types of non-volatile random access memories (RAMs), magnetic storage memory, single or multi-level Phase Change Memory (PCM), a resistive memory, nanowire memory, anti-ferroelectric memory, magnetoresistive random access memory (MRAM) memory that incorporates memristor technology, resistive memory including the metal oxide base, the oxygen vacancy base and the conductive bridge Random Access Memory (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thiristor based memory device. In some embodiments, 3D crosspoint memory may comprise a transistor-less stackable cross point architecture in which memory cells sit at the intersection of words lines and bit lines and are individually addressable and in which bit storage is based on a change in bulk resistance. A memory device may refer to the die itself and/or to a packaged memory product. In certain embodiments, a memory module with non-volatile memory may comply with one or more standards promulgated by the Joint Electron Device Engineering Council (JEDEC), such as JESD218, JESD219, JESD220-1, JESD223B, JESD223-1, or other suitable standard (the JEDEC standards cited herein are available at www.jedec.org). In certain embodiments, the SSD 104 may be capable of storing several terabytes of data or more.

In certain embodiments, the NAND memory 110 is configurable into SLC blocks 112 and QLC blocks 114 by the controller 106 of the SSD 104. The SLC blocks 112 appear as SLC NAND and the QLC blocks 114 appear as QLC NAND for storage of data. In certain embodiments, the controller 106 of the SSD 104 may include firmware 116 that implements a controller application 118, where the controller application 118 configures the NAND memory 110 into the SLC blocks 112 and the QLC blocks 114.

In certain embodiments, the host 102 may be comprised of any suitable computational device, such as a personal computer, a mainframe, a telephony device, a smart phone, a storage controller, a blade computer, a processor with memory, etc. In certain embodiments, the host 102 may communicate with the SSD 104 over a bus (such as a Peripheral Component Interconnect (PCIe), Serial Advanced Technology Attachment (SATA), Serial Attached Small Computer System Interface (SAS)) or a network, such as the Internet, a storage area network (SAN), a local area network (LAN), etc. In certain embodiments, the host 102 may communicate with the SSD 104 over a Non-Volatile Memory Express (NVMe) interface (http://www.nvmexpress.org).

In certain embodiments, the controller application 118 (implemented in firmware as shown in FIG. 1, or implemented in other embodiments via firmware, software, hardware or any combination thereof) that executes in the controller 106 of the SSD 104 programs the memory cells of the NAND memory 110. The SSD 104 also receives commands from the host 102, and then the controller application 118 executes the read and/or write with respect to the NAND complex 108 by converting the read and/or write commands received from the host 102 into memory operations. The controller 106 and the controller application 118 may be implemented in ASIC and/or firmware, software, or any combination thereof.

The SSD 104 may also include latches 120 that may comprise devices that may be in a plurality of states, where the latches 120 may be used for temporary storage of data in the SSD 104.

Therefore, FIG. 1 illustrates certain embodiments in which the controller application 118 configures the NAND memory 110 into SLC blocks 112 and QLC blocks 114, and moves data from SLC blocks 112 to QLC blocks 114 as needed, for conserving the limited storage space provided by the SLC blocks 112 in comparison to the larger storage space provided by the QLC blocks 114.

Figure 2:
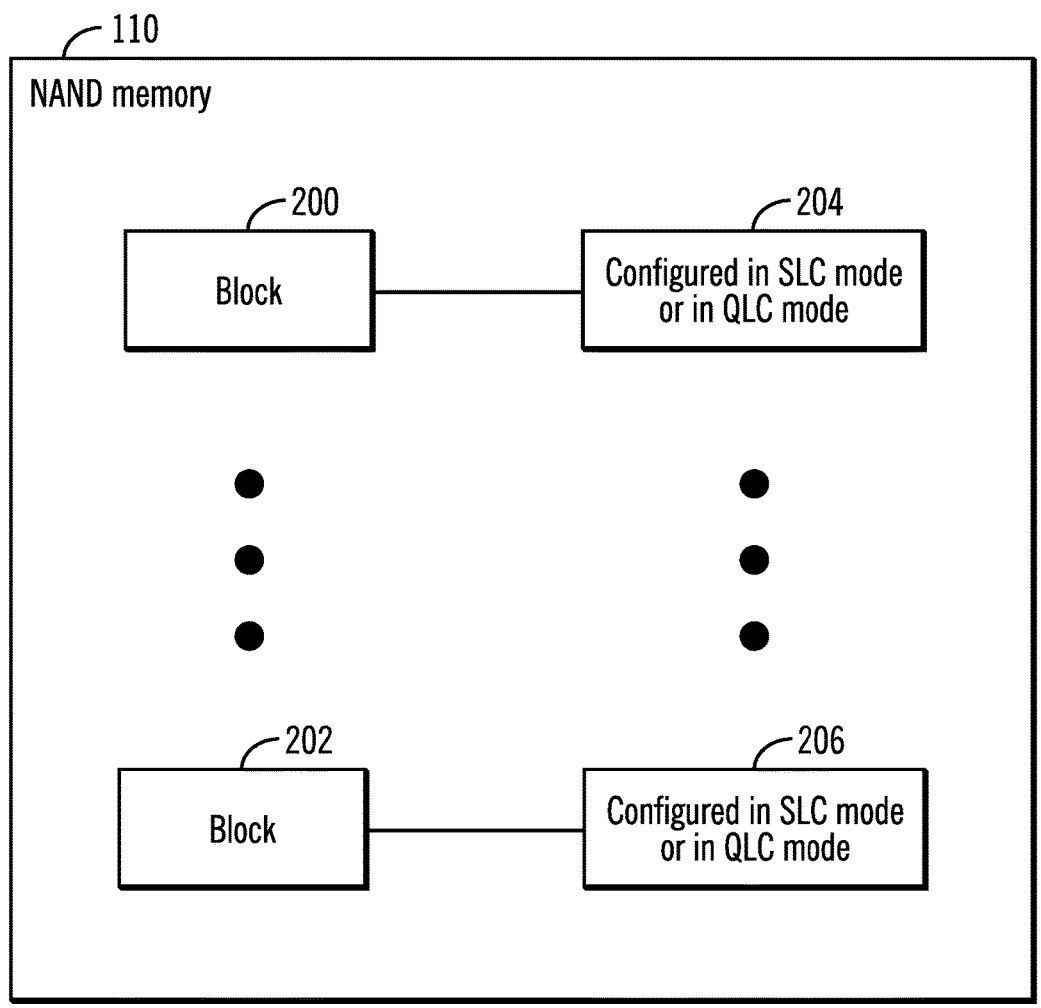
FIG. 2 illustrates a block diagram that shows how blocks of the NAND memory may be written in SLC mode or in QLC mode, in accordance with certain embodiments.

FIG. 2 illustrates a block diagram that shows how blocks of the NAND memory 110 may be written in SLC mode or in QLC mode, in accordance with certain embodiments.

The controller application that executes in the SSD 104 may configure the NAND memory 110 into a plurality of blocks 200, 202, where a block is a sequence of bits or bytes having a maximum length that is referred to as a block size. A whole block of data is read or written at a time.

Each of the blocks 200, 202 of the NAND memory 110 may be configured in a SLC mode or in a QLC mode as shown via reference numerals 204, 206. A block that is configured in a SLC mode stores 1 bit of data per memory cell, whereas a block that is configured in a QLC mode stores 4 bits of data per memory cell. I/O operations to blocks configured in the SLC mode may be performed relatively faster in comparison to the I/O operations to blocks configured in the QLC mode. Therefore, blocks in the SLC mode may be used for high bandwidth writes, whereas blocks in the QLC mode made be used for low bandwidth writes and the SLC mode may be referred to as a fast mode and the QLC mode may be referred to as a slow mode. However, the number of blocks configured in the SLC mode is relatively small in comparison to the number of blocks configured in the QLC mode. There may be a maximum limit on the number of blocks that may be configured in the SLC mode. The blocks configured in the SLC mode may be referred to as SLC blocks (as shown via reference numeral 112 in FIG. 1) and the blocks configured in the QLC mode may be referred to as QLC blocks (as shown via reference numeral 114 in FIG. 1).

In certain embodiments, if the limited number blocks configured in the SLC mode are close to being full then the data in some of the blocks configured in the SLC mode are moved to some of the blocks configured in the QLC mode. The movement of the data from the SLC blocks 112 to the QLC blocks 114 may also be performed periodically or as needed.

Figure 3:
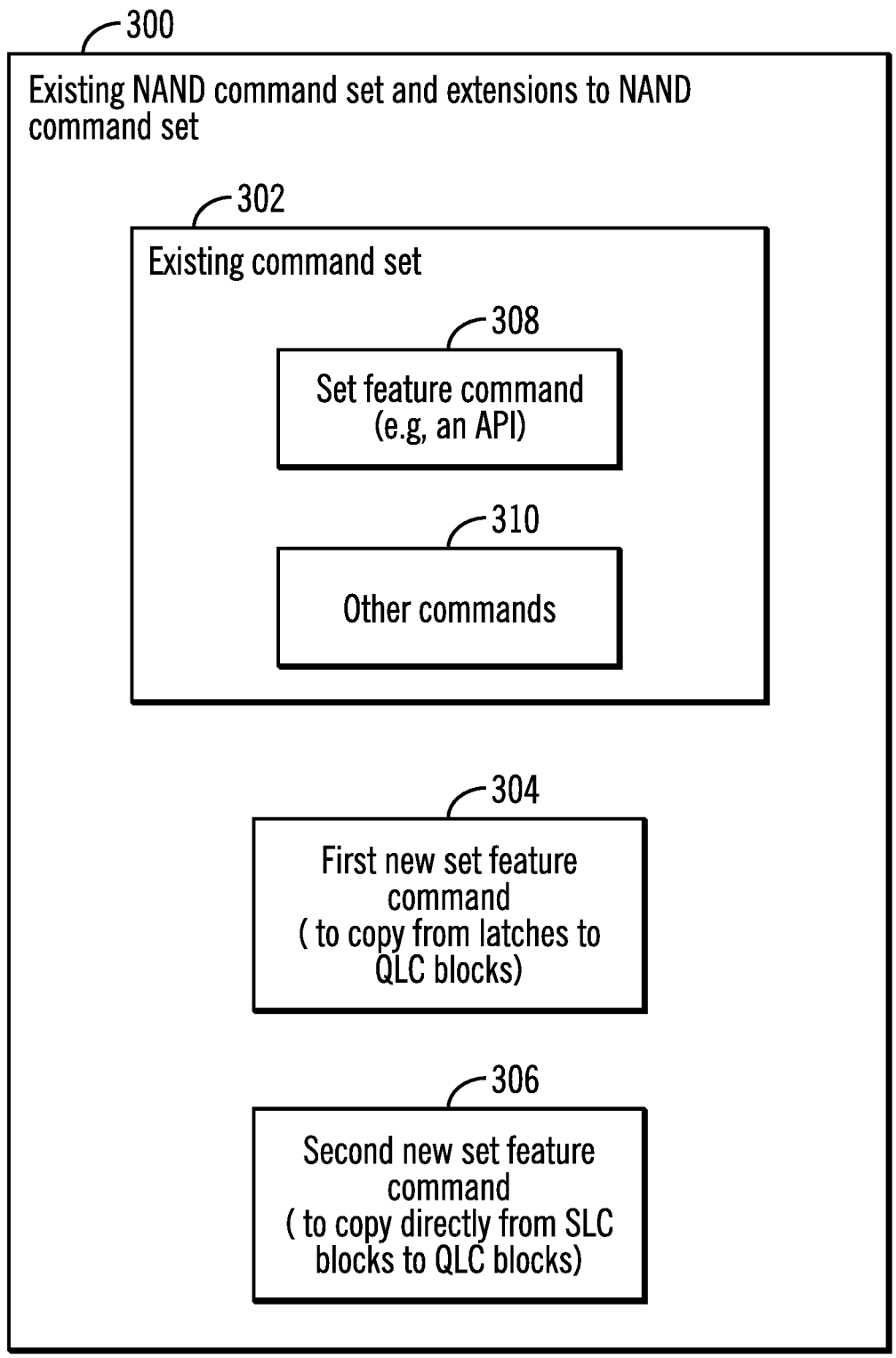
FIG. 3 illustrates a block diagram that shows an existing NAND command set and extensions to the NAND command set, in accordance with certain embodiments.

FIG. 3 illustrates a block diagram 300 that shows an existing NAND command set 302 and certain extensions to the NAND command set (the extensions are shown via reference numerals 304, 306), in accordance with certain embodiments.

The existing NAND command set 302 may be comprised of a "set feature" command 308 (also referred to as "set features" command) and other commands 310, where the set feature command 308 and the other commands 310 are described in the publication "Open NAND Flash Interface Specification," Revision 4.0, published Apr. 2, 2014, by the ONFI Workgroup, where further details of the ONFI workgroup are available at www.onfi.org. The set feature command 308 may be regarded as an Application Programming Interface (API) to modify the settings of a particular feature of the SSD 104.

In certain embodiments, the controller application 118 uses the set feature command 308 for internal data movements from SLC blocks 112 to the QLC blocks 114. In other embodiments, a first extension to the existing NAND command set may comprise a first new set feature command 304 to copy from the latches 120 to the QLC blocks 114 and the first new set feature command 304 may be used for internal data movements from SLC blocks 112 to the QLC blocks 114. In certain other embodiments, a second extension to the existing NAND command set may comprise a second new set feature command 306 to copy data directly from the SLC blocks 112 to the QLC blocks 114.

Figure 4:
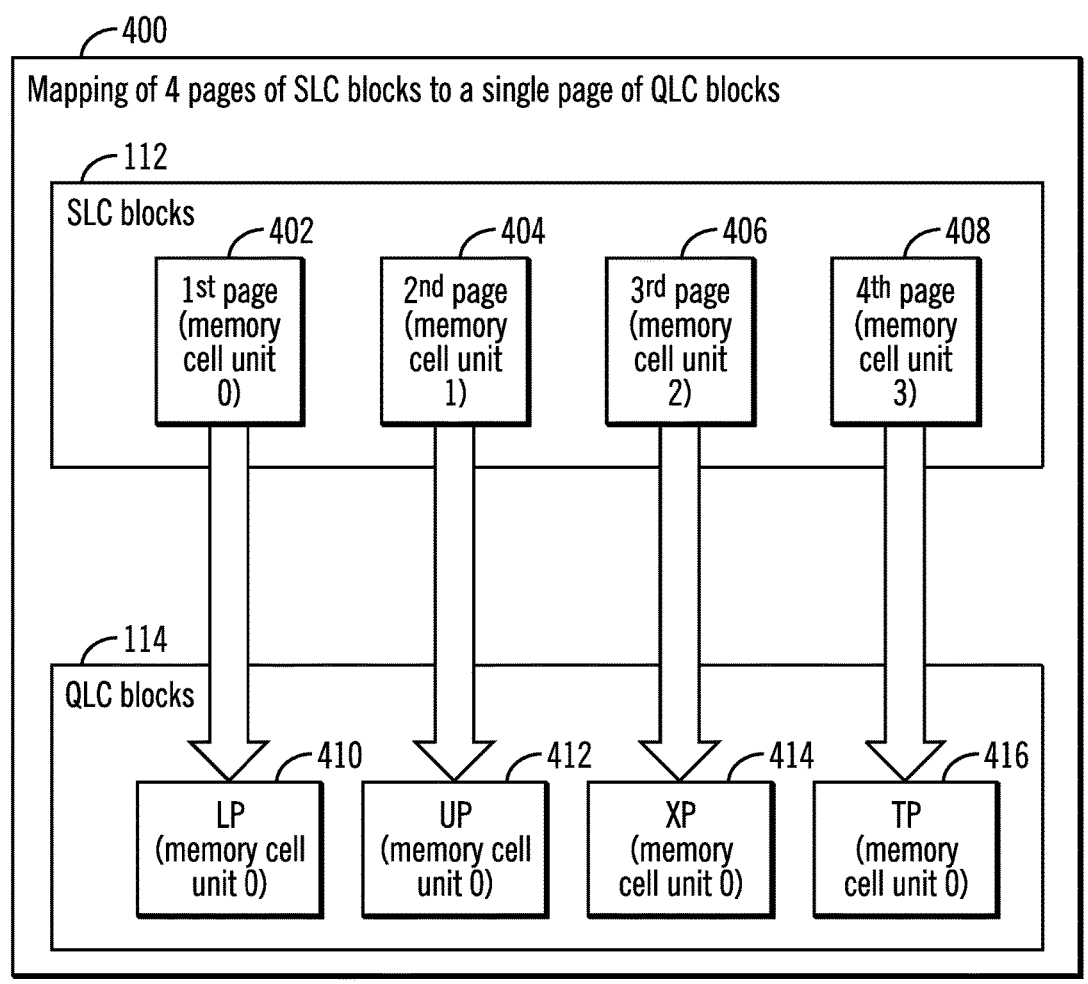
FIG. 4 illustrates a block diagram that shows how four pages of SLC blocks are mapped to a single page of QLC blocks, in accordance with certain embodiments.

FIG. 4 illustrates a block diagram 400 that shows how four pages of SLC blocks 112 are mapped to a single page of QLC blocks 114, in accordance with certain embodiments.

Memory cells are etched onto a silicon wafer in an array of columns (bitlines) and rows (wordlines). The intersection of a bitline and wordline constitutes the address of the memory cell. In certain embodiments, a memory cell that is encoded to store a plurality of bits may form a part of a plurality of different pages, with each bit of the memory cell corresponding to a different page. For example, for a memory cell that is encoded with four bits (i.e., memory cells in QLC blocks 114), one bit may correspond to a lower page (LP), another bit may correspond to an upper page (UP), another bit may correspond to an extra page (XP), and another bit may correspond to a top page (TP). Each page (e.g., LP, UP, XP, or TP) may comprise an aggregation of corresponding bits stored by a plurality of different cells of a wordline.

In certain embodiments, a plurality of memory cells may comprise a memory cell unit. In the SLC blocks 112 each wordline has 1 page, wherein in the QLC blocks 114 each wordline has 4 pages. For example, in FIG. 4, in the SLC blocks 112, for memory cell units numbered 0, 1, 2, 3, a first page, a second page, a third page, and a fourth page are shown via reference numerals 402, 404, 406, 408. Also, in FIG. 4, in the QLC blocks 114, for a memory cell unit numbered 0, four pages referred to as LP, UP, XP, TP are shown via reference numerals 410, 412, 414, 416, where LP, UP, XP, TP are all addressable by the same wordline.

Therefore, in FIG. 4, pages that reside on four different memory cell units of the SLC blocks 112 are all mapped into the same memory cell unit of the QLC blocks 114. In certain embodiments, the controller application 118 reads four different memory cell units of the SLC blocks 112 and writes them to a single memory cell unit of the QLC blocks 114. Thus 4 wordlines of SLC blocks 112 are mapped to a single wordline of the QLC blocks 114.

Figure 5:
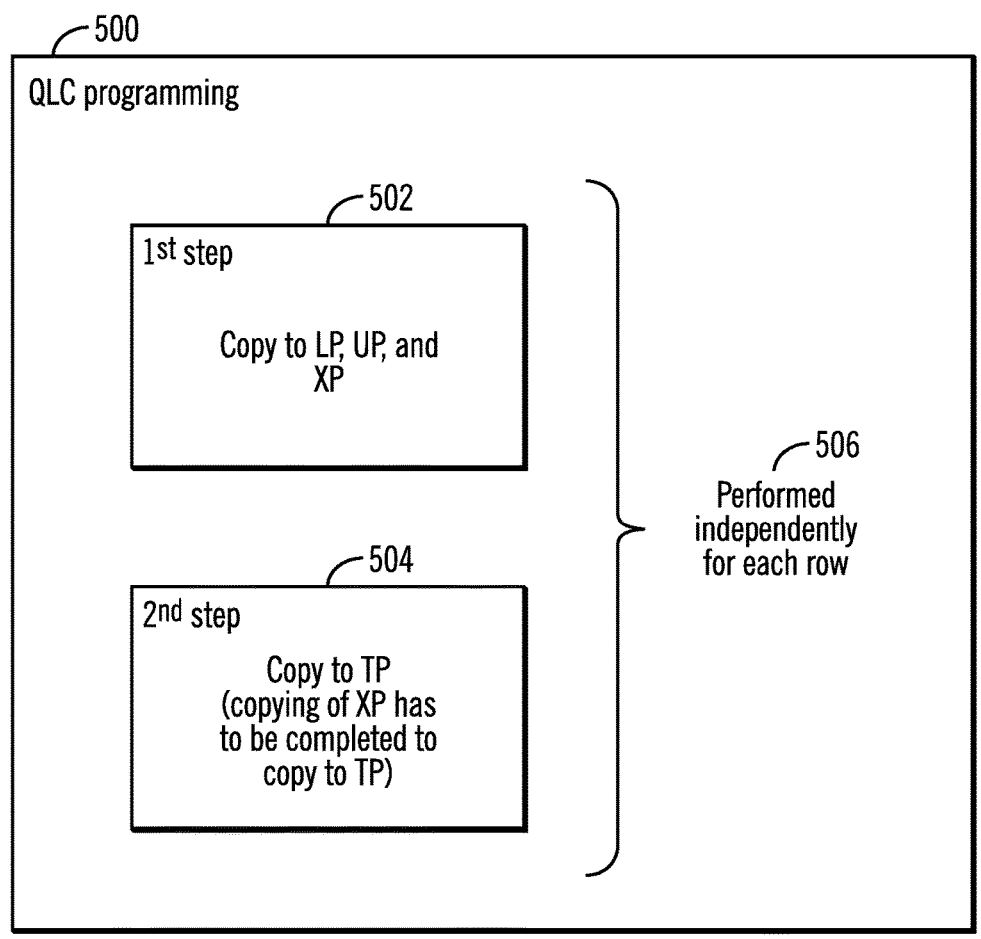
FIG. 5 illustrates a block diagram that shows how QLC programming is performed in two steps, in accordance with certain embodiments.

FIG. 5 illustrates a block diagram 500 that shows how QLC programming is performed in two steps, in accordance with certain embodiments. QLC programming refers to the writing of data to the QLC blocks 114.

In certain embodiments, in a first step 502, data is copied to LP, UP, and XP of a memory cell unit of a QLC block 114. In the second step 504 which is performed independently (as shown via reference numeral 506) of the first step 502 for each wordline (i.e., the first step 502 and the second step 504 may be performed in parallel), data is copied to the TP of the memory cell unit of the QLC block 114, where the copying of data to the XP has to be completed prior to copying of data to the TP.

Figure 6:
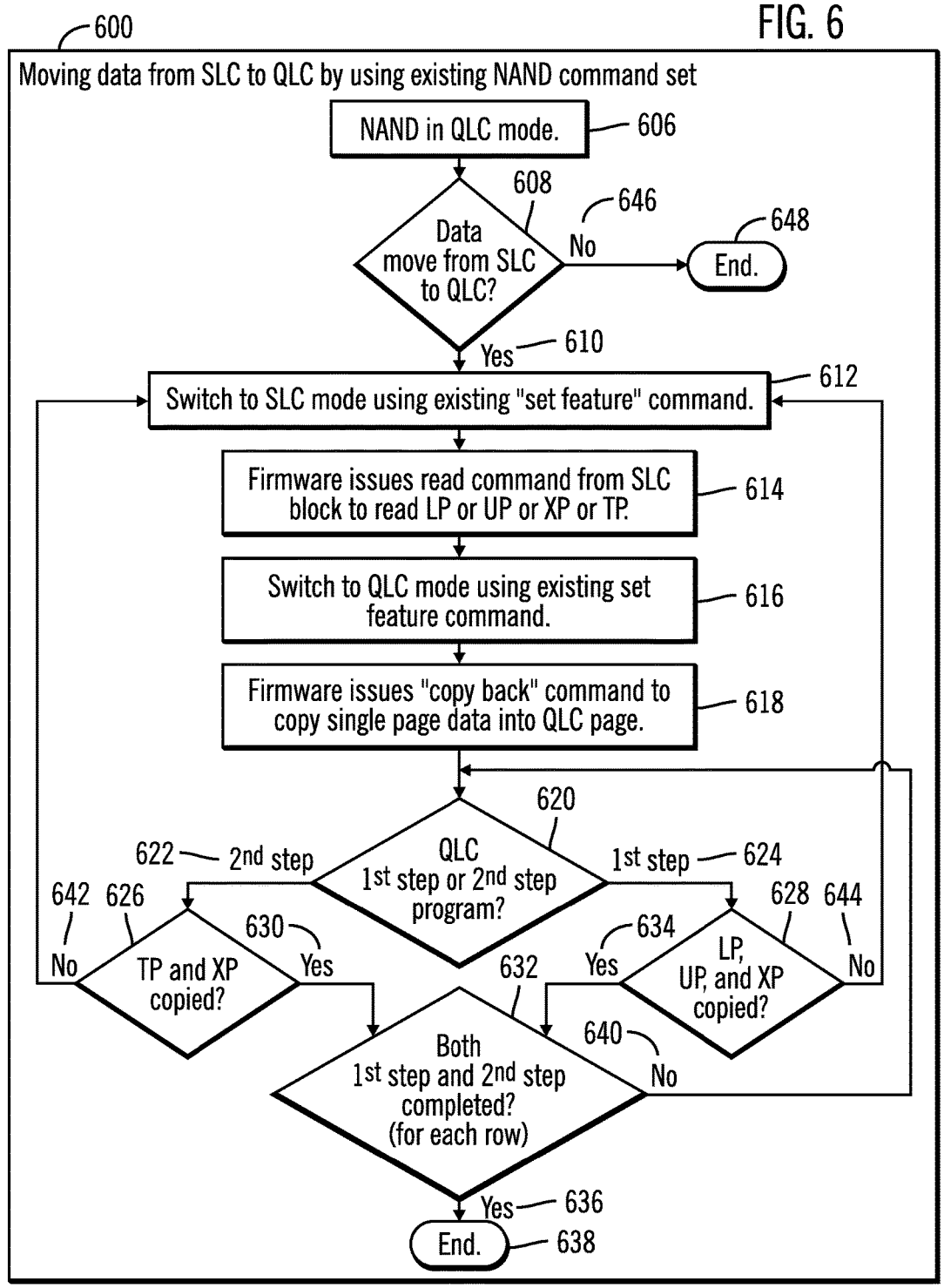
FIG. 6 illustrates a flowchart that shows how data is moved from SLC NAND to QLC NAND by using an existing NAND command set, in accordance with certain embodiments.

FIG. 6 illustrates a flowchart 600 that shows how data is moved from SLC NAND (i.e., SLC blocks 112) to QLC NAND (i.e., QLC blocks 114) by using an existing NAND command set 302, in accordance with certain embodiments. The operations shown in FIG. 6 may be performed by the controller application 118 that executes in the controller 106 of the SSD 104, and the operations move data from SLC NAND to QLC NAND without copying data to SRAM that may be present in the controller 106, i.e., internal data movements are performed within the NAND memory 110 to move data from SLC blocks 112 to QLC blocks 114 without transferring the data to the SRAM of the controller 106.

Control starts at block 606 in which the NAND memory 110 is in the QLC mode. Control proceeds to block 608 in which the controller application 118 determines whether a data move is needed from the SLC blocks 112 to the QLC blocks 114. If so ("Yes" branch 610) control proceeds to block 612 in which the controller application 118 switches the NAND memory 110 to SLC mode using the existing "set feature" command 308. The controller application 118 issues (at block 614) a read command from an SLC block 112 to read LP or UP or XP or TP (i.e., a page is read from the SLC NAND where the page will eventually be copied to one of LP, UP, XP, or TP of a memory cell unit of a QLC NAND), and then switches (at block 616) the NAND memory 110 to the QLC mode by using the existing "set feature" command 308. The controller application 118 then issues (at block 618) a "copy back" command to copy a single page data into a QLC page.

From block 618, control proceeds in to block 620 in which the controller application 118 determines whether the QLC $1^{st}$ step 502 or QLC $2^{nd}$ step 504 programming is in progress. Since the QLC $1^{st}$ step 502 and QLC $2^{nd}$ step 504 programming are performed independently of each other, control may proceed via branches 622 ($2^{nd}$ step) and 624 ($1^{st}$ step) to blocks 626 and 628 respectively.

At block 626, the controller application 118 determines whether TP and XP have been copied, and if so ("Yes" branch 630) control proceeds to block 632 in which the controller application 118 determines whether both $1^{st}$ step and $2^{nd}$ step programming have been completed for each row. At block 628, the controller application 118 determines whether LP, UP, and XP have been copied, and if so ("Yes" branch 634) control proceeds to block 632 in which the controller application 118 determines whether both $1^{st}$ step and $2^{nd}$ step programming have been completed for each row.

If at block 632, the controller application 118 determines that both $1^{st}$ step and $2^{nd}$ step programming have been completed for each row ("Yes" branch 636) then the process ends (at block 638). If at block 632, the controller application 118 determines that both $1^{st}$ step and $2^{nd}$ step programming have not been completed for each row ("No" branch 640) then control returns to block 620.

If at block 626, the controller application 118 determines that TP and XP have not been copied ("No" branch 642) then control returns to block 612. Additionally, if at block 628, the controller application 118 determines that LP, UP, and XP have not been copied ("No" branch 644) then control returns to block 612.

If at block 608, the controller application 118 determines that a data move is not needed from the SLC blocks 112 to the QLC blocks 114 ("No" branch 646) then the process ends (at block 648).

Therefore, FIG. 6 illustrates certain embodiments in which data is moved from SLC blocks to QLC blocks by using the existing "set feature" command 308 of the existing NAND command set 302.

Figure 7:
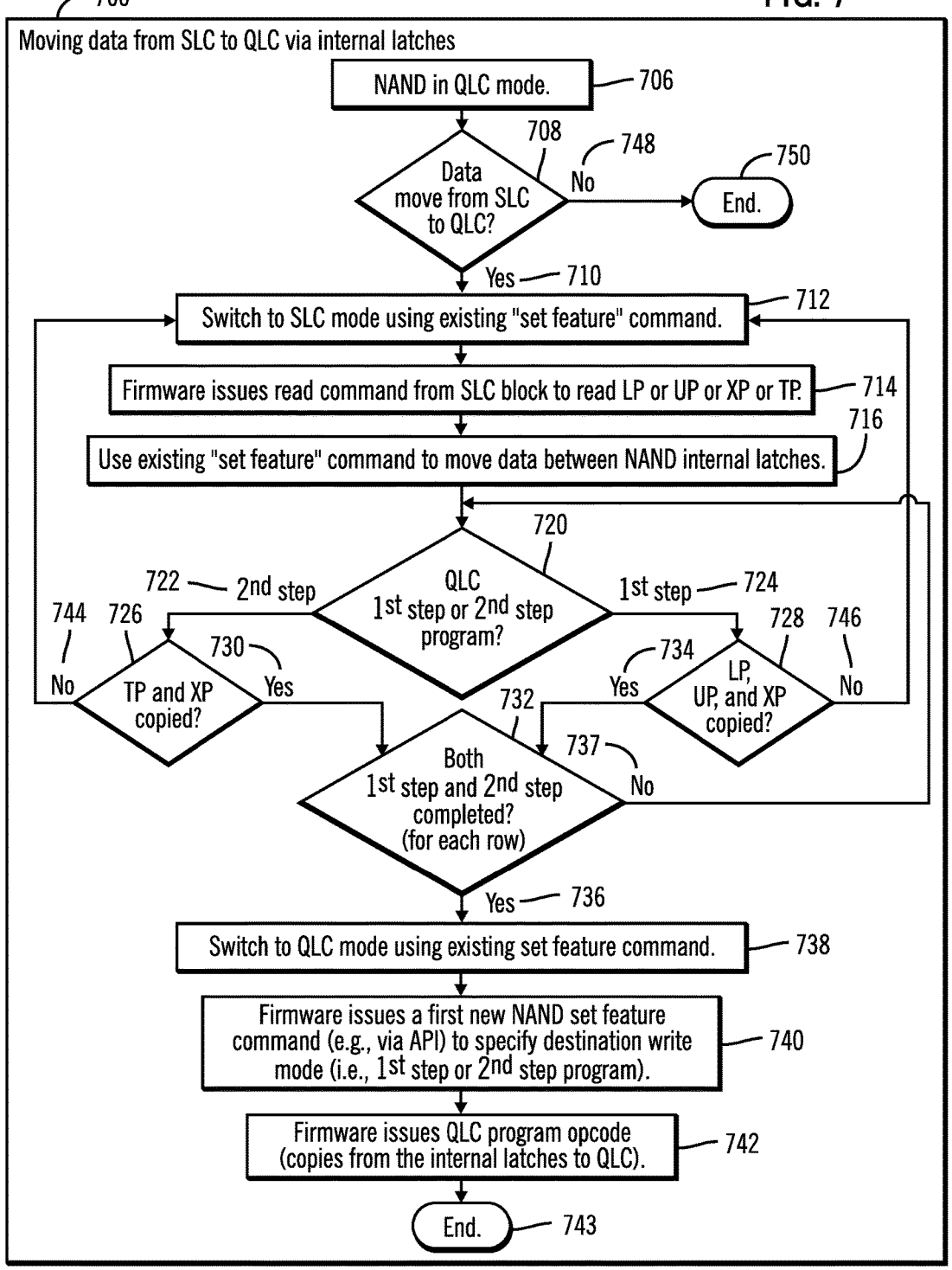
FIG. 7 illustrates a flowchart that shows how data is moved from SLC NAND to QLC NAND via internal latches, in accordance with certain embodiments.

FIG. 7 illustrates a flowchart 700 that shows how data is moved from SLC NAND to QLC NAND via internal latches, in accordance with certain embodiments. The operations shown in FIG. 7 may be performed by the controller application 118 that executes in the controller 106 of the SSD 104.

Control starts at block 706 in which the NAND memory 110 is in the QLC mode. Control proceeds to block 708 in which the controller application 118 determines whether a data move is needed from the SLC blocks 112 to the QLC blocks 114. If so ("Yes" branch 710) control proceeds to block 712 in which the controller application 118 switches the NAND memory 110 to SLC mode using the existing "set feature" command 308. The controller application 118 issues (at block 714) a read command from an SLC block 112 to read LP or UP or XP or TP, and then uses (at block 716) the existing "set feature" command 308 to move data between NAND internal latches (i.e., data is copied from SLC blocks 112 to the latches 120).

From block 716 control proceeds in to block 720 in which the controller application 118 determines whether the QLC $1^{st}$ step 502 or QLC $2^{nd}$ step 504 programming is in progress. Since the QLC $1^{st}$ step 502 and QLC $2^{nd}$ step 504 programming are performed independently of each other, control may proceed via branches 722 ($2^{nd}$ step) and 724 ($1^{st}$ step) to blocks 726 and 728 respectively.

At block 726, the controller application 118 determines whether TP and XP have been copied, and if so ("Yes" branch 730) control proceeds to block 732 in which the controller application 118 determines whether both $1^{st}$ step and $2^{nd}$ step programming have been completed for each row. At block 728, the controller application 118 determines whether LP, UP, and XP have been copied, and if so ("Yes" branch 734) control proceeds to block 732 in which the controller application 118 determines whether both $1^{st}$ step and $2^{nd}$ step programming have been completed for each row.

If at block 732, the controller application 118 determines that both $1^{st}$ step and $2^{nd}$ step programming have been completed for each row ("Yes" branch 736) then the controller application 118 switches (at block 738) the NAND memory 110 to QLC mode using the existing "set feature" command 308. The controller application 118 issues (at block 740) a first new NAND set feature command 304 (e.g., via an API) to specify a destination write mode (i.e., a $1^{st}$ step or $2^{nd}$ step program). Then, the controller application 118 issues (at block 742) a QLC program opcode that copies data from the internal latches 120 to the QLC blocks 114, and the process ends (at block 743). If at block 732, the controller application 118 determines that both $1^{st}$ step and $2^{nd}$ step programming have not been completed for each row ("No" branch 737) then control returns to block 720.

If at block 726, the controller application 118 determines that TP and XP have not been copied ("No" branch 744) then control returns to block 712. Additionally, if at block 728, the controller application 118 determines that LP, UP, and XP have not been copied ("No" branch 746) then control returns to block 712.

If at block 708, the controller application 118 determines that a data move is not needed from the SLC blocks 112 to the QLC blocks 114 ("No" branch 748) then the process ends (at block 750).

Therefore, FIG. 7 illustrates certain embodiments in which data is moved from SLC blocks to QLC blocks by using internal latches 120.

Figure 8:
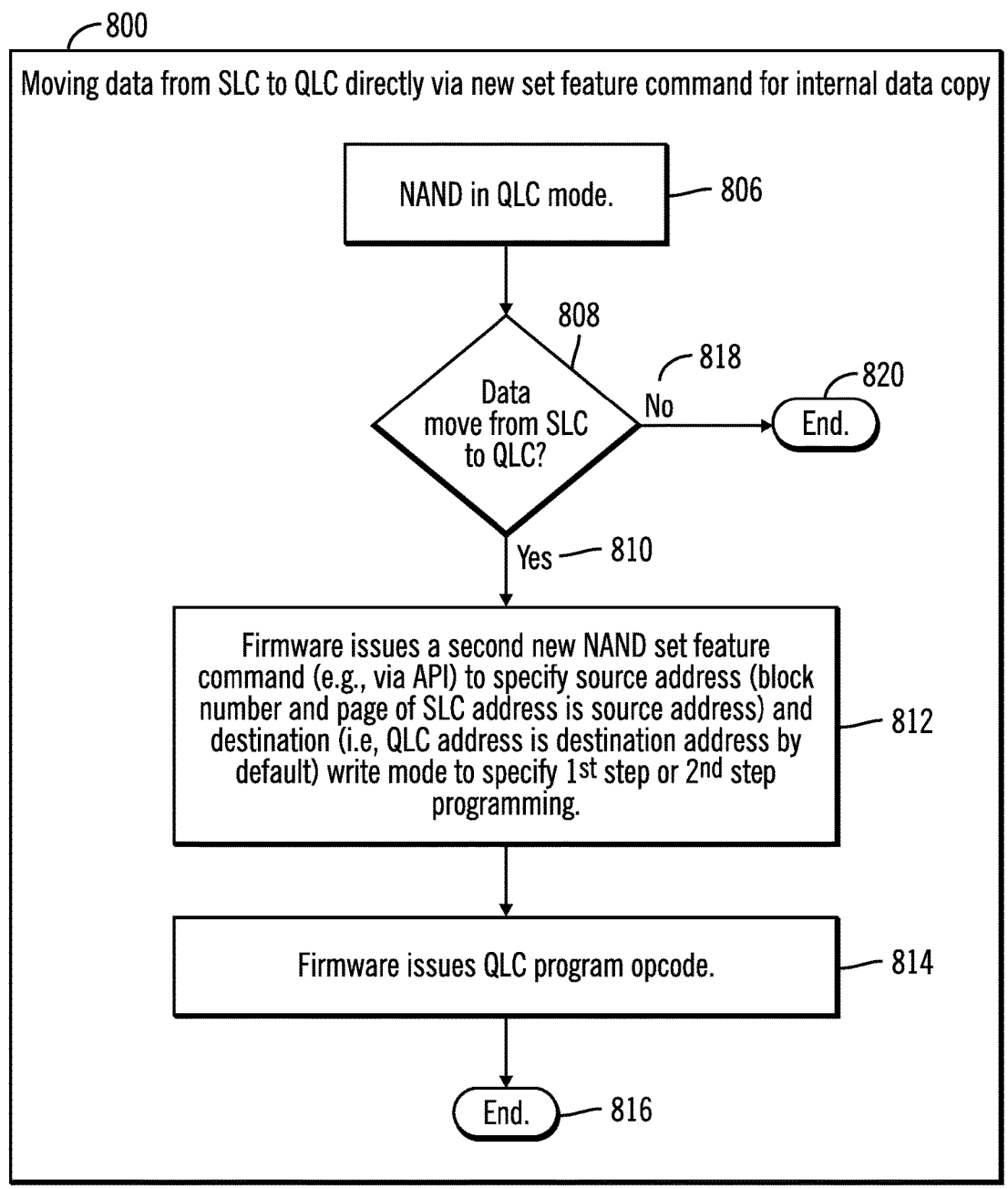
FIG. 8 illustrates a flowchart that shows how data is moved from SLC NAND to QLC NAND via a new set feature command for internal data copy, in accordance with certain embodiments.

FIG. 8 illustrates a flowchart 800 that shows how data is moved from SLC NAND to QLC NAND via a new set feature command for internal data copy, in accordance with certain embodiments. The operations shown in FIG. 8 may be performed by the controller application 118 that executes in the controller 106 of the SSD 104.

Control starts at block 806 in which the NAND memory 110 is in the QLC mode. Control proceeds to block 808 in which the controller application 118 determines whether a data move is needed from the SLC blocks 112 to the QLC blocks 114. If so ("Yes" branch 810), then control proceeds to block 812 in which the controller application 118 issues a second new NAND set feature command 306 (e.g., via API) to specify source address (block number and page of SLC address is source address) and destination (QLC address is destination address by default) write mode to specify $1^{st}$ step or $2^{nd}$ step programming. Then the controller application 118 issues (at block 814) a QLC program opcode to perform the internal copying of data directly from SLC blocks 112 to the QLC blocks 114, and the process ends (at block 816).

If at block 808, the controller application 118 determines that a data move is not needed ("No" branch 818) from the SLC blocks 112 to the QLC blocks 114, then the process end (at block 820).

Therefore, FIG. 8 illustrates certain embodiments in which data is moved from SLC NAND to QLC NAND via a new set feature command (i.e., the second new set feature command 306) for internal data copy. The second new set feature command 306 takes the SLC address as source, the QLC address as destination and performs the data move operation internally.

Figure 9:
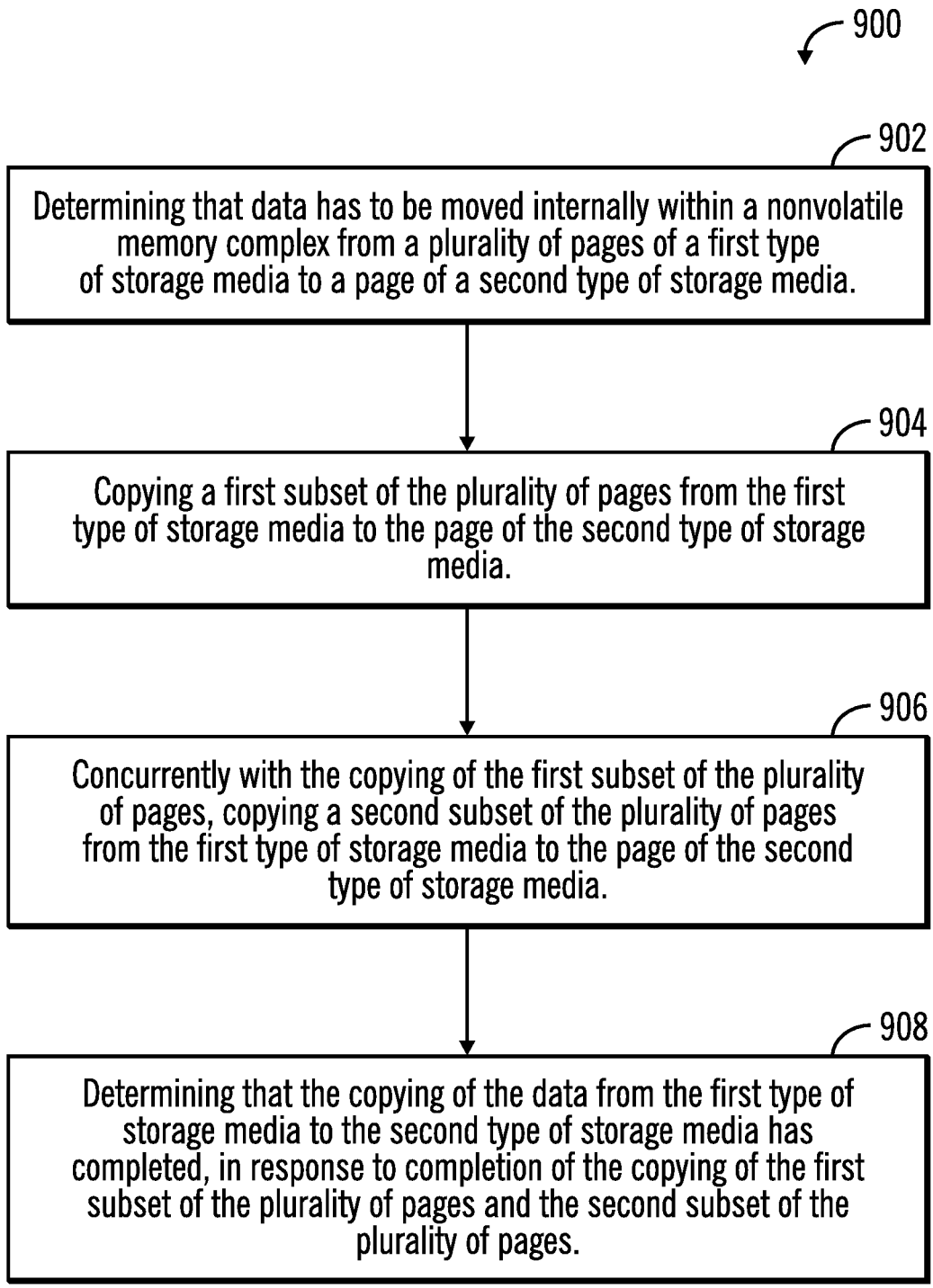
FIG. 9 illustrates a flowchart that shows how data is moved from SLC NAND to QLC NAND, in accordance with certain embodiments.

FIG. 9 illustrates a flowchart 900 that shows how data is moved from SLC NAND to QLC NAND, in accordance with certain embodiments. The operations shown in FIG. 9 may be performed by the controller application 118 that executes in the controller 106 of the SSD 104.

Control starts at block 902 in which a determination is made that data has to be moved internally within a non-volatile memory complex 108 from a plurality of pages of a first type of storage media 112 (e.g., SLC block 112) to a page of a second type of storage media 114 (e.g., QLC blocks 114). A first subset (e.g., LP, UP, XP) of the plurality of pages is copied (at block 904) from the first type of storage media to the page of the second type of storage media. Concurrently with the copying of the first subset of the plurality of pages, a second subset (e.g., TP) of the plurality of pages is copied (at block 906) from the first type of storage media to the page of the second type of storage media. In response to completion of the copying of the first subset of the plurality of pages and the second subset of the plurality of pages, it is determined (at block 908) that the copying of the data from the first type of storage media to the second type of storage media has completed.

Therefore, FIGS. 1-9 illustrate certain embodiments for copying data from blocks configured in a SLC mode to blocks configured in a QLC mode.

The embodiments shown in FIGS. 1-9 have been described for QLC NAND devices using specific types of write mechanisms. However, in alternative embodiments, other types of write mechanisms may be used for QLC NAND devices or for TLC NAND or for MLC NAND devices.

The described operations may be implemented as a method, apparatus or computer program product using standard programming and/or engineering techniques to produce software, firmware, hardware, or any combination thereof. The described operations may be implemented as code maintained in a "computer readable storage medium", where a processor may read and execute the code from the computer readable storage medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs, Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Figure 10:
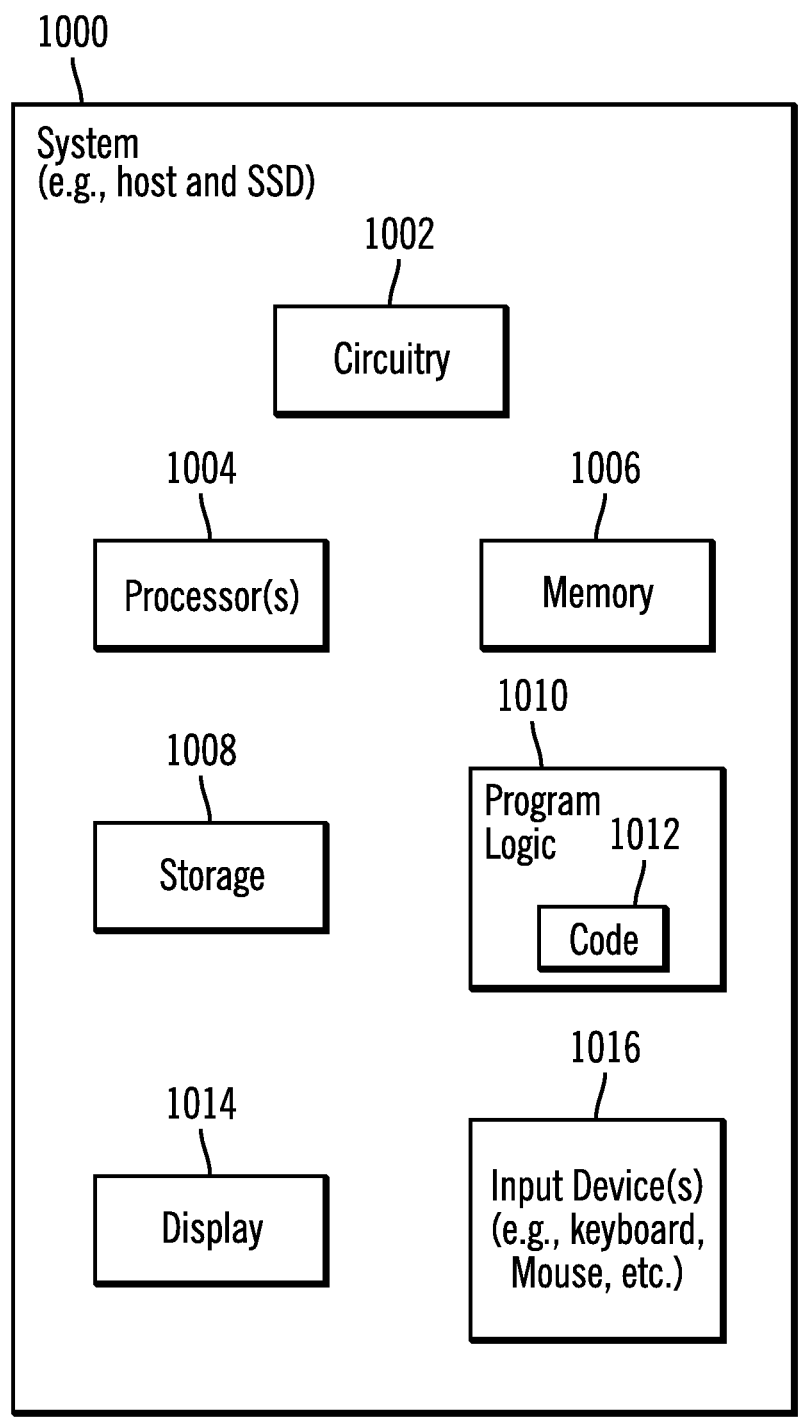
FIG. 10 illustrates a block diagram of a system, in accordance with certain embodiments.

FIG. 10 illustrates a block diagram of a system 1000 that includes both the host 102 (the host 102 comprises at least a processor) and the solid state drive 104, in accordance with certain embodiments. For example, in certain embodiments the system 1000 may be a computer (e.g., a laptop computer, a desktop computer, a tablet, a cell phone or any other suitable computational device) that has the host 102 and the solid state drive 104 both included in the system 1000. For example, in certain embodiments the system 1000 may be a laptop computer that includes the solid state drive 104. The system 1000 may include a circuitry 1002 that may in certain embodiments include at least a processor 1004. The system 1000 may also include a memory 1006 (e.g., a volatile memory device), and storage 1008. The storage 1008 may include the solid state drive 104 or other drives or devices including a non-volatile memory device (e.g., EEPROM, ROM, PROM, flash, firmware, programmable logic, etc.). The storage 1008 may also include a magnetic disk drive, an optical disk drive, a tape drive, etc. The storage 1008 may comprise an internal storage device, an attached storage device and/or a network accessible storage device. The system 1000 may include a program logic 1010 including code 1012 that may be loaded into the memory 1006 and executed by the processor 1004 or circuitry 1002. In certain embodiments, the program logic 1010 including code 1012 may be stored in the storage 1008. In certain other embodiments, the program logic 1010 may be implemented in the circuitry 1002. Therefore, while FIG. 10 shows the program logic 1010 separately from the other elements, the program logic 1010 may be implemented in the memory 1006 and/or the circuitry 1002. The system 1000 may also include a display 1014 (e.g., an liquid crystal display (LCD), a light emitting diode (LED) display, a cathode ray tube (CRT) display, a touchscreen display, or any other suitable display). The system 1000 may also include one or more input devices 1016, such as, a keyboard, a mouse, a joystick, a trackpad, or any other suitable input devices). Other components or devices beyond those shown in FIG. 10 may also be found in the system 1000.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

EXAMPLES

The following examples pertain to further embodiments.

Example 1 is a method for improving bandwidth of a storage device, wherein the method comprises determining that data has to be moved internally within a non-volatile memory from a plurality of pages of a first type of storage media to a page of a second type of storage media; copying a first subset of the plurality of pages from the first type of storage media to the page of the second type of storage media; concurrently with the copying of the first subset of the plurality of pages, copying a second subset of the plurality of pages from the first type of storage media to the page of the second type of storage media; and determining that the copying of the data from the first type of storage media to the second type of storage media has completed, in response to completion of the copying of the first subset of the plurality of pages and the second subset of the plurality of pages.

In example 2, the subject matter of example 1 may include that the plurality of pages comprise a first page, a second page, a third page and a fourth page, wherein the first subset is the first page, the second page and the third page, wherein the second subset is the fourth page, and wherein copying of the second subset of the plurality of pages from the first type of storage media to the page of the second type of storage media comprises: copying the fourth page from the first type of storage media to the second type of storage media, in response to determining that the third page has already been copied from the first type of storage media to the second type of storage media.

In example 3, the subject matter of example 1 may include copying the data from the first type of storage media to a set of latches of the non-volatile memory; subsequent to copying the data from the first type of storage media to the set of latches of the non-volatile memory, copying the data from the set of latches to the second type of storage media via operations comprising: switching from a first mode to a second mode using a first set feature command; issuing a second feature set command to specify a destination write mode; and issuing a program opcode to program the second type of storage media.

In example 4, the subject matter of example 1 may include issuing a feature set command to specify a source address comprising a block number and a page of the first type of storage media and a write mode for a destination address comprising a block number and a page of the second type of storage media; and issuing a program opcode to program the second type of storage media.

In example 5, the subject matter of example 1 may include that the data is moved from the first type of storage media to the second type of storage media without generating an intermediate copy outside of the non-volatile memory.

In example 6, the subject matter of example 1 may include that on an average, I/O operations to the first type of storage media are performed faster in comparison to I/O operations to the second type of storage media, wherein the non-volatile memory has fewer blocks configured as the first type of storage media in comparison to the second type of storage media, and wherein data has to be moved periodically from the first type of storage media to the second type of storage media to conserve space in the first type of storage media.

In example 7, the subject matter of example 1 may include that the first type of storage media is single-level cell (SLC) NAND, and wherein the second type of storage media is quad-level cell (QLC) NAND.

In example 8, the subject matter of example 1 may include that the first type of storage media is single-level cell (SLC) NAND, and wherein the second type of storage media is multi-level cell (MLC) NAND.

Example 9 is a non-volatile memory device for improving bandwidth of a storage device, wherein the non-volatile memory device is comprised of a non-volatile memory; and a controller coupled to the non-volatile memory, wherein the controller is operable to: determine that data has to be moved internally within the non-volatile memory from a plurality of pages of a first type of storage media to a page of a second type of storage media; copy a first subset of the plurality of pages from the first type of storage media to the page of the second type of storage media; copy a second subset of the plurality of pages from the first type of storage media to the page of the second type of storage media, concurrently with the copy of the first subset of the plurality of pages; and determine that the copy of the data from the first type of storage media to the second type of storage media has completed, in response to completion of the copy of the first subset of the plurality of pages and the second subset of the plurality of pages.

In example 10, the subject matter of example 9 may include the plurality of pages comprise a first page, a second page, a third page and a fourth page, wherein the first subset is the first page, the second page and the third page, wherein the second subset is the fourth page, and wherein the controller to copy the second subset of the plurality of pages from the first type of storage media to the page of the second type of storage media is to: copy the fourth page from the first type of storage media to the second type of storage media, in response to a determination that the third page has already been copied from the first type of storage media to the second type of storage media.

In example 11, the subject matter of example 9 may include that the controller is further operable to: copy the data from the first type of storage media to a set of latches of the non-volatile memory; subsequent to the copy of the data from the first type of storage media to the set of latches of the non-volatile memory, copy the data from the set of latches to the second type of storage media via operations performed to: switch from a first mode to a second mode using a first set feature command; issue a second feature set command to specify a destination write mode; and issue a program opcode to program the second type of storage media.

In example 12, the subject matter of example 9 may include that the controller is further operable to: issue a feature set command to specify a source address comprising a block number and a page of the first type of storage media and a write mode for a destination address comprising a block number and a page of the second type of storage media; and issue a program opcode to program the second type of storage media.

In example 13, the subject matter of example 9 may include that the controller is further operable to: cause the data to be moved from the first type of storage media to the second type of storage media without generation of an intermediate copy outside of the non-volatile memory.

In example 14, the subject matter of example 9 may include that on an average, I/O operations to the first type of storage media are performed faster in comparison to I/O operations to the second type of storage media, wherein the non-volatile memory has fewer blocks configured as the first type of storage media in comparison to the second type of storage media, and wherein data has to be moved periodically from the first type of storage media to the second type of storage media to conserve space in the first type of storage media.

In example 15, the subject matter of example 9 may include that the first type of storage media is single-level cell (SLC) NAND, and wherein the second type of storage media is quad-level cell (QLC) NAND.

In example 16, the subject matter of example 9 may include that the first type of storage media is single-level cell (SLC) NAND, wherein the second type of storage media is multi-level cell (MLC) NAND.

Example 17 is a system for improving bandwidth of a storage device, wherein the system comprises a display; a non-volatile memory device comprising a non-volatile memory; and a controller coupled to the non-volatile memory, wherein the controller is operable to: determine that data has to be moved internally within the non-volatile memory from a plurality of pages of a first type of storage media to a page of a second type of storage media; copy a first subset of the plurality of pages from the first type of storage media to the page of the second type of storage media; copy a second subset of the plurality of pages from the first type of storage media to the page of the second type of storage media, concurrently with the copy of the first subset of the plurality of pages; and determine that the copy of the data from the first type of storage media to the second type of storage media has completed, in response to completion of the copy of the first subset of the plurality of pages and the second subset of the plurality of pages.

In example 18, the subject matter of example 17 may include that the plurality of pages comprise a first page, a second page, a third page and a fourth page, wherein the first subset is the first page, the second page and the third page, wherein the second subset is the fourth page, and wherein the controller to copy the second subset of the plurality of pages from the first type of storage media to the page of the second type of storage media is to: copy the fourth page from the first type of storage media to the second type of storage media, in response to a determination that the third page has already been copied from the first type of storage media to the second type of storage media.

In example 19, the subject matter of example 17 may include that the controller is further operable to: copy the data from the first type of storage media to a set of latches of the non-volatile memory; subsequent to the copy of the data from the first type of storage media to the set of latches of the non-volatile memory, copy the data from the set of latches to the second type of storage media via operations performed to: switch from a first mode to a second mode using a first set feature command; issue a second feature set command to specify a destination write mode; and issue a program opcode to program the second type of storage media.

In example 20, the subject matter of example 17 may include that the controller is further operable to: issue a feature set command to specify a source address comprising a block number and a page of the first type of storage media and a write mode for a destination address comprising a block number and a page of the second type of storage media; and issue a program opcode to program the second type of storage media.

In example 21, the subject matter of example 17 may include that the controller is further operable to: cause the data to be moved from the first type of storage media to the second type of storage media without generation of an intermediate copy outside of the non-volatile memory.

In example 22, the subject matter of example 17 may include that on an average, I/O operations to the first type of storage media are performed faster in comparison to I/O operations to the second type of storage media, wherein the non-volatile memory has fewer blocks configured as the first type of storage media in comparison to the second type of storage media, and wherein data has to be moved periodically from the first type of storage media to the second type of storage media to conserve space in the first type of storage media.

In example 23, the subject matter of example 17 may include that the first type of storage media is single-level cell (SLC) NAND, and wherein the second type of storage media is quad-level cell (QLC) NAND.

In example 24, the subject matter of example 17 may include that the first type of storage media is single-level cell (SLC) NAND, wherein the second type of storage media is multi-level cell (MLC) NAND.

Example 25 is a system for improving bandwidth of a storage device, wherein the system comprises: means for determining that data has to be moved internally within a non-volatile memory from a plurality of pages of a first type of storage media to a page of a second type of storage media; means for copying a first subset of the plurality of pages from the first type of storage media to the page of the second type of storage media; means for concurrently with the copying of the first subset of the plurality of pages, copying a second subset of the plurality of pages from the first type of storage media to the page of the second type of storage media; and means for determining that the copying of the data from the first type of storage media to the second type of storage media has completed, in response to completion of the copying of the first subset of the plurality of pages and the second subset of the plurality of pages.

All optional features of any of the systems and/or apparatus described above may also be implemented with respect to the method or process described above, and specifics in the examples may be used anywhere in one or more embodiments. Additionally, all optional features of the method or process described above may also be implemented with respect to any of the system and/or apparatus described above, and specifics in the examples may be used anywhere in one or more embodiments.

What is claimed is:
1. A method, comprising:
determining that data has to be moved internally within a non-volatile memory from a plurality of pages of a first type of storage media to a page of a second type of storage media;

copying a first subset of the plurality of pages from the first type of storage media to the page of the second type of storage media;
concurrently with the copying of the first subset of the plurality of pages, copying a second subset of the plurality of pages from the first type of storage media to the page of the second type of storage media; and
determining that the copying of the data from the first type of storage media to the second type of storage media has completed, in response to completion of the copying of the first subset of the plurality of pages and the second subset of the plurality of pages.

2. The method of claim 1, wherein the plurality of pages comprise a first page, a second page, a third page and a fourth page, wherein the first subset is the first page, the second page and the third page, wherein the second subset is the fourth page, and wherein copying of the second subset of the plurality of pages from the first type of storage media to the page of the second type of storage media comprises:
copying the fourth page from the first type of storage media to the second type of storage media, in response to determining that the third page has already been copied from the first type of storage media to the second type of storage media.

3. The method of claim 1, the method further comprising: copying the data from the first type of storage media to a set of latches of the non-volatile memory;
subsequent to copying the data from the first type of storage media to the set of latches of the non-volatile memory, copying the data from the set of latches to the second type of storage media via operations comprising:
switching from a first mode to a second mode using a first set feature command;
issuing a second feature set command to specify a destination write mode; and
issuing a program opcode to program the second type of storage media.

4. The method of claim 1, the method further comprising:
issuing a feature set command to specify a source address comprising a block number and a page of the first type of storage media and a write mode for a destination address comprising a block number and a page of the second type of storage media; and
issuing a program opcode to program the second type of storage media.

5. The method of claim 1, wherein the data is moved from the first type of storage media to the second type of storage media without generating an intermediate copy outside of the non-volatile memory.

6. The method of claim 1, wherein on an average, I/O operations to the first type of storage media are performed faster in comparison to I/O operations to the second type of storage media, wherein the non-volatile memory has fewer blocks configured as the first type of storage media in comparison to the second type of storage media, and wherein data has to be moved periodically from the first type of storage media to the second type of storage media to conserve space in the first type of storage media.

7. The method of claim 1, wherein the first type of storage media is single-level cell (SLC) NAND, and wherein the second type of storage media is quad-level cell (QLC) NAND.

8. The method of claim 1, wherein the first type of storage media is single-level cell (SLC) NAND, and wherein the second type of storage media is multi-level cell (MLC) NAND.

9. A non-volatile memory device, comprising:
a non-volatile memory; and
a controller coupled to the non-volatile memory, wherein the controller is operable to:
determine that data has to be moved internally within the non-volatile memory from a plurality of pages of a first type of storage media to a page of a second type of storage media;
copy a first subset of the plurality of pages from the first type of storage media to the page of the second type of storage media;
copy a second subset of the plurality of pages from the first type of storage media to the page of the second type of storage media, concurrently with the copy of the first subset of the plurality of pages; and
determine that the copy of the data from the first type of storage media to the second type of storage media has completed, in response to completion of the copy of the first subset of the plurality of pages and the second subset of the plurality of pages.

10. The non-volatile memory device of claim 9, wherein the plurality of pages comprise a first page, a second page, a third page and a fourth page, wherein the first subset is the first page, the second page and the third page, wherein the second subset is the fourth page, and wherein the controller to copy the second subset of the plurality of pages from the first type of storage media to the page of the second type of storage media is to:
copy the fourth page from the first type of storage media to the second type of storage media, in response to a determination that the third page has already been copied from the first type of storage media to the second type of storage media.

11. The non-volatile memory device of claim 9, wherein the controller is further operable to:
copy the data from the first type of storage media to a set of latches of the non-volatile memory;
subsequent to the copy of the data from the first type of storage media to the set of latches of the non-volatile memory, copy the data from the set of latches to the second type of storage media via operations performed to:
switch from a first mode to a second mode using a first set feature command;
issue a second feature set command to specify a destination write mode; and
issue a program opcode to program the second type of storage media.

12. The non-volatile memory device of claim 9, wherein the controller is further operable to:
issue a feature set command to specify a source address comprising a block number and a page of the first type of storage media and a write mode for a destination address comprising a block number and a page of the second type of storage media; and
issue a program opcode to program the second type of storage media.

13. The non-volatile memory device of claim 9, wherein the controller is further operable to: cause the data to be moved from the first type of storage media to the second type of storage media without generation of an intermediate copy outside of the non-volatile memory.

14. The non-volatile memory device of claim 9, wherein on an average, I/O operations to the first type of storage media are performed faster in comparison to I/O operations to the second type of storage media, wherein the non-volatile memory has fewer blocks configured as the first type of storage media in comparison to the second type of storage media, and wherein data has to be moved periodically from the first type of storage media to the second type of storage media to conserve space in the first type of storage media.

15. The non-volatile memory device of claim 9, wherein the first type of storage media is single-level cell (SLC) NAND, and wherein the second type of storage media is quad-level cell (QLC) NAND.

16. The non-volatile memory device of claim 9, wherein the first type of storage media is single-level cell (SLC) NAND, and wherein the second type of storage media is multi-level cell (MLC) NAND.

17. A system, comprising:
a display;
a non-volatile memory device comprising a non-volatile memory; and
a controller coupled to the non-volatile memory, wherein the controller is operable to:
determine that data has to be moved internally within the non-volatile memory from a plurality of pages of a first type of storage media to a page of a second type of storage media;
copy a first subset of the plurality of pages from the first type of storage media to the page of the second type of storage media;
copy a second subset of the plurality of pages from the first type of storage media to the page of the second type of storage media, concurrently with the copy of the first subset of the plurality of pages; and
determine that the copy of the data from the first type of storage media to the second type of storage media has completed, in response to completion of the copy of the first subset of the plurality of pages and the second subset of the plurality of pages.

18. The system of claim 17, wherein the plurality of pages comprise a first page, a second page, a third page and a fourth page, wherein the first subset is the first page, the second page and the third page, wherein the second subset is the fourth page, and wherein the controller to copy the second subset of the plurality of pages from the first type of storage media to the page of the second type of storage media is to:
copy the fourth page from the first type of storage media to the second type of storage media, in response to a determination that the third page has already been copied from the first type of storage media to the second type of storage media.

19. The system of claim 17, wherein the controller is further operable to:
copy the data from the first type of storage media to a set of latches of the non-volatile memory;
subsequent to the copy of the data from the first type of storage media to the set of latches of the non-volatile memory, copy the data from the set of latches to the second type of storage media via operations performed to:
switch from a first mode to a second mode using a first set feature command;
issue a second feature set command to specify a destination write mode; and
issue a program opcode to program the second type of storage media.

20. The system of claim 17, wherein the controller is further operable to:
issue a feature set command to specify a source address comprising a block number and a page of the first type of storage media and a write mode for a destination address comprising a block number and a page of the second type of storage media; and
issue a program opcode to program the second type of storage media.

* * * * *